United States Patent [19]
Ochi et al.

[11] Patent Number: 5,299,003
[45] Date of Patent: Mar. 29, 1994

[54] SIGNAL PROCESSING APPARATUS FOR CHANGING THE FREQUENCY CHARACTERISTICS OF AN INPUT SIGNAL

[75] Inventors: Atsuo Ochi, Moriguchi; Masayuki Yoneyama, Takatsuki; Yasuo Hamamoto, Neyagawa; Akihiro Takeuchi, Ikoma; Masaaki Kobayashi, Kawanishi; Haruo Ohta, Hirakata, all of Japan

[73] Assignee: Matsushita Electric Industrial Co., Ltd., Osaka, Japan

[21] Appl. No.: 849,332

[22] Filed: Mar. 10, 1992

[51] Int. Cl.⁵ ............................................. H04N 5/213
[52] U.S. Cl. .................................... 348/607; 358/340
[58] Field of Search ............... 358/167, 141, 160, 320, 358/327, 336, 340; 364/724.01, 724.16; 375/11; H04N 5/213

[56] References Cited

U.S. PATENT DOCUMENTS

| | | |
|---|---|---|
| 4,611,231 | 9/1986 | Kobayashi . |
| 4,908,581 | 3/1990 | Honjo ............................ 358/327 X |
| 5,117,291 | 5/1992 | Fadavi-Ardekani et al. ....... 358/167 |
| 5,126,846 | 6/1992 | Niimura ............................ 358/167 |

FOREIGN PATENT DOCUMENTS

190942A3  8/1986  European Pat. Off. .

Primary Examiner—Victor R. Kostak
Attorney, Agent, or Firm—Wenderoth, Lind & Ponack

[57] ABSTRACT

A signal processing apparatus for changing the frequency characteristics of an input signal, e.g.—a video or audio signal, allows a signal to pass through a transmission circuit in a positive time sequence and then, allows the signal to be transmitted through another transmission circuit having the same transmission characteristics in a reverse time sequence with respect to the positive time sequence. Also, while the transmission circuit is arranged to have a zero-phase characteristic, each segment of a continuous signal is processed throughout a period which is equal to at least two times a duration of an impulse response direction of the transmission circuit. Accordingly, unwanted wave errors appearing at discontinuous regions of the signals are eliminated.

8 Claims, 11 Drawing Sheets

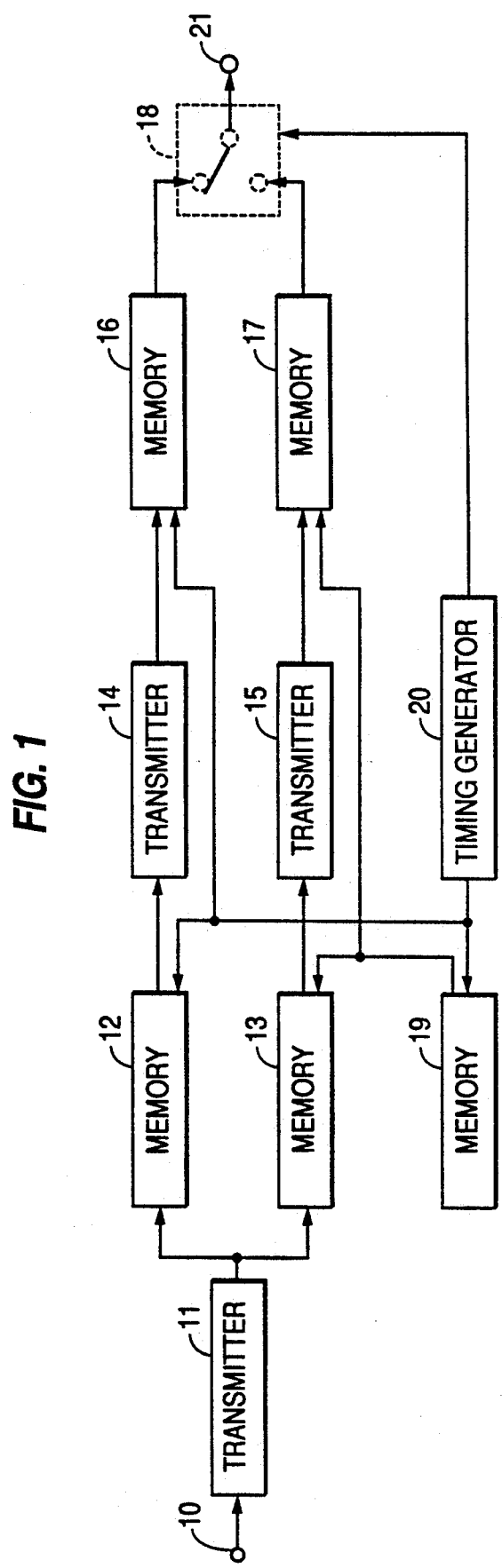

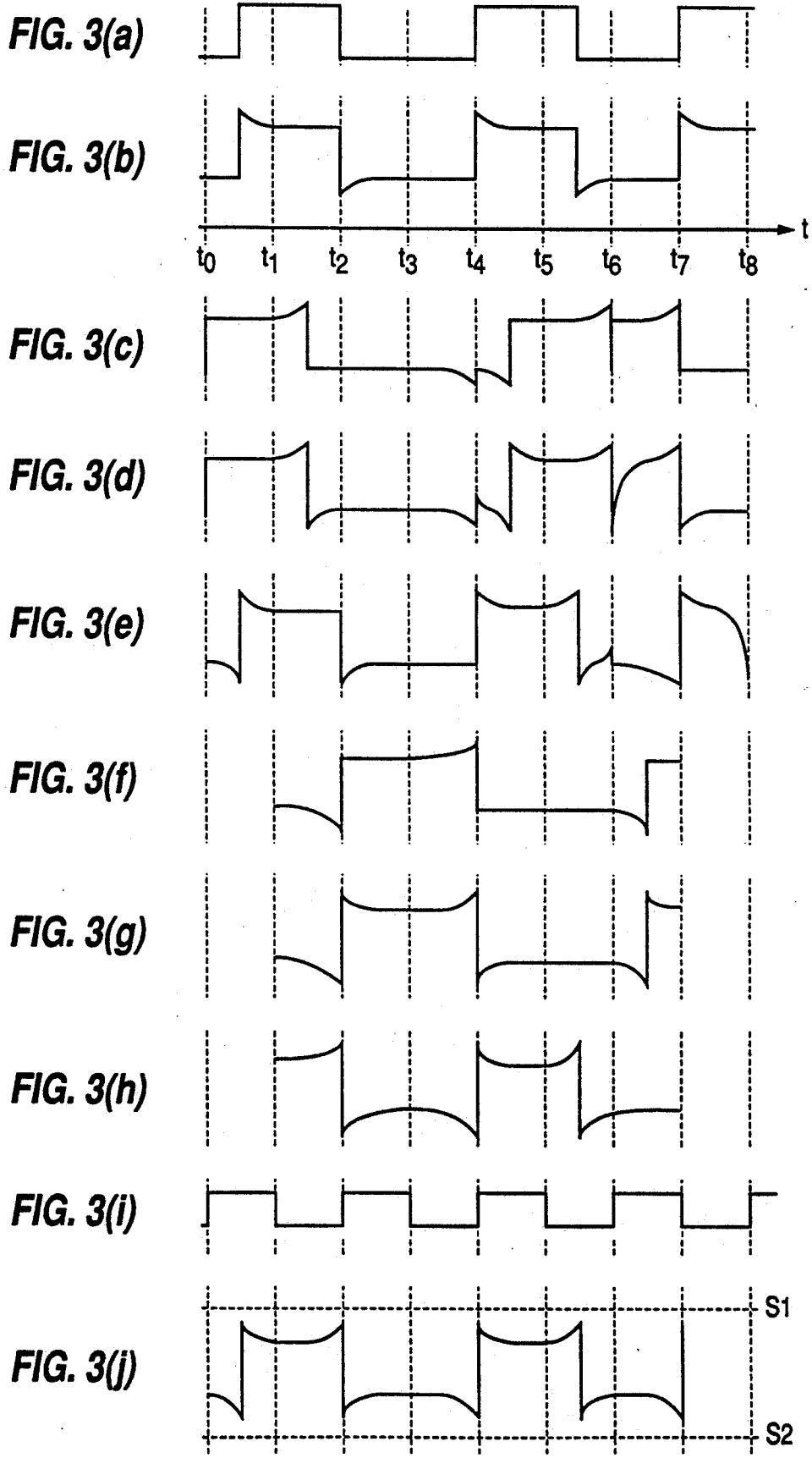

FIG. 5(a) | D1F | D1S | D2F | D2S | D3F | D3S | D4F | D4S | D5F |
FIG. 5(b) | D1S | D1F | D2S | D2F | D3S | D3F | D4S | D4F | D6F |
FIG. 5(c) | | D1S | D2F | D2S | D3F | D3S | D4F | D4S | D5F |
FIG. 5(d) | | D2F | D1S | D3F | D2S | D4F | D3S | D5F | D4S |
FIG. 5(e)
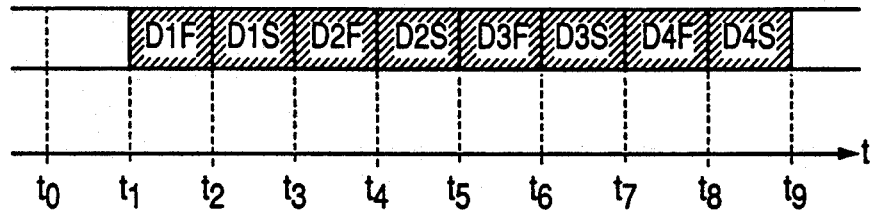
FIG. 5(f) | | D1F | D1S | D2F | D2S | D3F | D3S | D4F | D4S |
$t_0$ $t_1$ $t_2$ $t_3$ $t_4$ $t_5$ $t_6$ $t_7$ $t_8$ $t_9$

AMPLITUDE ACCEPTED BY LIMITER $T_1$    $T_1$

SIGNAL PROCESSING APPARATUS FOR CHANGING THE FREQUENCY CHARACTERISTICS OF AN INPUT SIGNAL

BACKGROUND OF THE INVENTION

1. Field of the Invention

The present invention relates to a signal processing apparatus for changing the frequency characteristics of an input signal, e.g.—a video or audio signal.

2. Description of the Prior Art

A video tape recorder for recording and playing back video signals contains a frequency modulation/demodulation circuit in which as white noise is developed in FM transmission lines, the level of noise in a demodulated signal is increased by an increase of frequency, which is known as a triangular noise characteristic. For minimizing such an unwanted noise level increase, a signal processing technique is provided in which an input signal of interest is amplified in its medium and high frequency ranges (or emphasized for increase in the frequency deviation) prior to frequency modulation and then, after demodulation, its medium and high frequency ranges are attenuated in the amplitude (or deemphasized). Another noise reduction technique may also be applied in which during recording non-linear preemphasis is provided for a small amplitude, high frequency component of the signal which is then non-linear deemphasized during playback.

However, the increase of frequency deviation by emphasis effects is restricted to a certain level due to confining of the frequency band in an FM transmission line to a limited range determined by electromagnetic transformation effects and thus, the signal-to-noise (S/N) ratio of a reproduced signal will stay low within a limit. This disadvantage is attributed to not only a video tape recorder but also any other systems for transmission of frequency modulated signals e.g. for satellite broadcasting service.

FIG. 11 illustrates an emphasizing circuit of the prior art, in which a video signal fed to an input terminal 110 is emphasized and transferred to an output terminal 114. The emphasizing circuit shown in FIG. 11 comprises a capacitor 111 (capacitance: c), a resistor 112 (resistance: Rb), and another resistor 113 (resistance: Ra). In operation, a signal denoted by a in FIG. 12 is shifted by the circuit to a waveform denoted by b at the output terminal 114. A common video tape recorder is arranged to record such a waveform a of a video signal shown in FIG. 12 onto a magnetic tape through frequency modulation. In practice, the signal is however frequency modulated with its amplitude being clipped between two levels denoted by S1 and S2 shown in FIG. 12, because the frequency band in an electromagnetic transformation system across an FM transmission line is limited in range. Hence, a resultant frequency demodulated signal will contain errors of waveform distortion. If the emphasizing level is attenuated for averting the clipping action, the S/N ratio in the reproduced signal will be reduced by a corresponding degree.

FIG. 13 shows a non-linear emphasizing circuit of the prior art, in which an input signal fed to an input terminal 115 is filtered by a highpass filter (HPF) 116, consisting of capacitor and a resistor, to a high frequency component signal which is in turn amplitude limited by a limiter 117 and added by an adder circuit 118 to the original signal. A sum signal is then transmitted from an output terminal 119. FIGS. 14(a)–14(d) show different waveforms of the input signal in the non-linear emphasizing circuit of FIG. 13, in which FIG. 14(a) illustrates an input signal at the input terminal 115; FIG. 14(b) illustrates an output of the HPF 116,; FIG. 14(c) illustrates an output of the limiter 117, and FIG. 14(d) illustrates output from the output terminal 119. During playback, the non-linear emphasized signal shown in FIG. 14(d) is non-linearly deemphasized to a waveform as shown in FIG. 14(a). At the time, a small amplitude noise in a high frequency component of the signal developed during record and playback action will be attenuated. In FIG. 14(a)–14 (d), the period when the output signal of the HPF 116 is amplitude limited by the limiter 117 is represented by T1. However, a part of the noise in each period T1 will hardly be attenuated through the non-linear deemphasizing action during the playback. As the result, noise components remain intensively at the periods T1 where the waveform exhibits sharp changes between rise and decay, thus causing a reproduced image to be reduced in quality. More specifically, the noise component appears at the rear end of each edge between rise and decay and will thus be more noticeable during reproduction.

SUMMARY OF THE INVENTION

It is an object of the present invention to provide a signal processing apparatus capable of carrying out a frequency characteristic changing process using a small-sized circuit in which an unwanted waveform distortion in a reproduced signal is eliminated or more particularly, the amplitude of a residue noise at each waveform edge of the signal is attenuated.

A signal processing apparatus according to the present invention allows a signal to pass through a transmission circuit in a positive time sequence and then, allows the signal to be transmitted through another transmission circuit having the same transmission characteristic in a reverse time sequence with respect to the positive time sequence. Also, while the transmission circuit is arranged to have a zero-phase characteristic, each segment of a continuous signal is processed throughout a period which is equal to at least two times a duration of an impulse response duration of the transmission circuit. Hence, unwanted waveform errors appearing at discontinuous regions of the signal will be eliminated.

In an aspect of the present invention, a signal processing apparatus comprises: a first transmission circuit having a transmission characteristic of G and an impulse response duration of $\alpha$ for transmission of an input signal; a first memory circuit having a storage capacity of M ($M \geq 2 \times \alpha$) for storing an output of the first transmission circuit in a predetermined time sequence and transmitting the same in a reverse time sequence to the predetermined time sequence; a second transmission circuit having the transmission characteristic of G for transmission of an output of the first memory circuit; a second memory circuit having the storage capacity of M for storing the output of the first transmission circuit for a length M of time and transmitting the same in a reverse time sequence to a storing time sequence; a third memory circuit having the storage capacity of M for storing the output of the first transmission circuit after a delay time ranging from $\alpha$ to ($M-\alpha$) from the storage action of the first memory circuit and transmitting the same in a reverse time sequence to a storing time sequence; a third transmission circuit having the transmission characteristic of G for transmission of an output of the third memory circuit; a fourth memory circuit having the storage capacity of M for storing the output of the third transmission circuit for the period M and transmitting the same in a reverse time sequence to the storing time sequence; and a switch circuit for transmitting the output of the second memory circuit during a part of the period M from a start of an action of the first memory circuit to a start of an action of the third memory circuit and the output of the fourth memory circuit during the other part from a start of the action of the third memory circuit to the start of a succeeding action of the first memory circuit.

In another aspect of the invention, a signal processing apparatus comprises: a first transmission circuit having a transmission characteristic of G and an impulse response duration of $\alpha$ for transmission of an input signal; a first memory circuit having a storage capacity of M ($M \geq 2 \times \alpha$) for storing an output of the first transmission circuit in a predetermined time sequence and transmitting the same in a time sequence to the predetermined time sequence; a second transmission circuit having the transmission characteristic of G for transmission of an output of the first memory circuit; a second memory circuit having the storage capacity of M for storing the output of the first transmission circuit for a length M of time after a delay time ranging from $\alpha$ to $(M-\alpha)$ from the action of the first memory circuit and transmitting the same in a reverse time sequence to the storing time sequence; a third transmission circuit having the transmission characteristic of G for transmission of an output of the second memory circuit; a switch circuit for transmitting the output of the third transmission circuit during a part of the period M from a start of an action of the first memory circuit to a start of an action of the second memory circuit and the output of the second transmission circuit during the other part from a start of the action of the second memory circuit to a start of a succeeding action of the first memory circuit; and a third memory circuit having a storage capacity ranging from at least $\alpha$ to $(M-\alpha)$ for storing an output of the switch circuit and transmitting the same in a reverse time sequence to the storing time sequence.

In a further aspect of the invention, a video signal processing apparatus comprises: a first IIR type digital filter for band-limit filtering an input digital video signal; a first time base inverting circuit for storing the input digital video signal in a predetermined time sequence and transmitting the same in a reverse time sequence to the predetermined time sequence; a second IIR type digital filter for band-limit filtering an output of the first time base inverting circuit; a second time base inverting circuit for storing an output of the second IIR type digital filter and transmitting the same in a reverse sequence to the storing time sequence; a first adder for adding an output of the second time base inverting circuit to an output of the first IIR type digital filter which has been time base matched; a linear amplifier circuit for amplifying a sum output of the first adder by a predetermined rate; a non-linear circuit for converting an amplitude of an output of the linear amplifier circuit to a non-linear form; and a second adder for summing an output of the non-linear circuit and the original input digital video signal, which has been time base matched, to a signal which contains less phase distortion as compared with the original input digital video signal and becomes increased in the effect of amplification as its amplitude is decreased.

In a still further aspect of the invention, a video signal processing apparatus comprises: a first IIR type digital filter for band-limit filtering an input digital video signal; a first time base inverting circuit for storing the input digital video signal in a predetermined time sequence and transmitting the same in a reverse time sequence to the predetermined time sequence; a second IIR type digital filter for band-limit filtering an output of the first time base inverting circuit; a second time base inverting circuit for storing an output of the second IIR type digital filter and transmitting the same in a reverse sequence to the storing time sequence; an adder for adding an output of the second time base inverting circuit to an output of the first IIR type digital filter which has been time base matched; a linear amplifier circuit for amplifying a sum output of the adder by a predetermined rate; a non-linear circuit for converting an amplitude of an output of the linear amplifier circuit to a non-linear form; and a subtractor for subtracting an output of the non-linear circuit from the original input digital video signal, which has been time base matched, thus to produce a signal which contains less phase distortion as compared with the original input digital video signal and becomes increased in the effect of amplitude restriction as its amplitude is decreased.

In a still further aspect of the invention, a video signal processing apparatus comprises: a first IIR type digital filter for band-limit filtering an input digital video signal; N (N is an integer) time base inverting circuits arranged parallel to the first IIR type digital filter for time base inverting the input signal at intervals of a given time; N IIR type digital filters for band-limit filtering N outputs of the time base inverting circuits respectively; a selector switch for selectively transmitting N outputs of the IIR type digital filters in a row; an (N+1)th time base inverting circuit for time base inverting the row of outputs of the selector switch to their original time base forms; an adder for adding an output of the (N+1)th time base inverting circuit to an output of the first IIR type digital filter which has been time base matched; a linear amplifier circuit for amplifying a sum output of the adder by a predetermined rate; a non-linear circuit for converting an amplitude of an output of the linear amplifier circuit to a non-linear form; and another adder for summing an output of the non-linear circuit and the original input digital video signal, which has been time base matched, to a signal which contains less phase distortion as compared with the original input digital video signal and becomes increased in the effect of amplification as its amplitude is decreased.

In a still further aspect of the invention, a video signal processing apparatus comprises: a first IIR type digital filter for band-limit filtering an input digital video signal; N (N is an integer) time base inverting circuits arranged parallel to the first IIR type digital filter for time base inverting the input signal at intervals of a given time; N IIR type digital filters for band-limit filtering N outputs of the time base inverting circuits respectively; a selector switch for selectively transmitting the N number of outputs of the IIR type digital filters in a row; an (N+1)th time base inverting circuit for time base inverting the row of the outputs of the selector switch to their original time base forms; an adder for adding an output of the (N+1)th time base inverting circuit to an output of the first IIR type digital filter which has been time base matched; a linear amplifier circuit for amplifying a sum output of the adder by a predetermined rate; a non-linear circuit for converting an amplitude of an output of the linear amplifier circuit to a non-linear form; and a subtractor for subtracting an output of the non-linear circuit from the original input digital video signal, which has been time base matched, thus to produce a signal which contains less phase distortion as compared with the original input digital video signal and becomes increased in the effect of amplification as its amplitude is decreased.

BRIEF DESCRIPTION OF THE DRAWINGS

FIG. 1 is a block diagram of a signal processing circuit according to the present invention;

FIGS. 3(a)-3(i) are waveform diagrams of the signals in the signal processing circuit;

FIGS. 5(a)-5(f) are timing charts showing the action of signals in the signal processing circuit shown in FIG. 4;

DESCRIPTION OF THE PREFERRED EMBODIMENTS

Figure 2A:
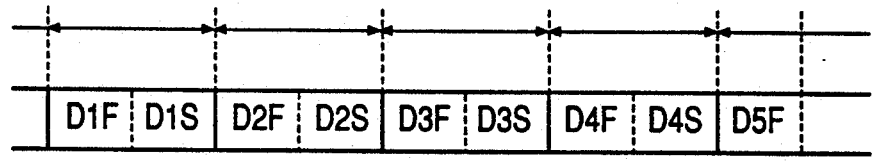
FIGS. 2(a)-2(h) are timing charts showing the action of signals in the signal processing circuit.

Preferred embodiments of the present invention will be described referring to the accompanying drawings. FIG. 1 is a block diagram of a signal processing apparatus showing a first embodiment of the present invention. FIGS. 2(a)-2(h) show the timing action of signals in the signal processing apparatus shown in FIG. 1. FIGS. 3(a)-3(j) are waveform diagrams of the signals according to the apparatus of FIG. 1.

As shown in FIG. 1, an input terminal 10 and a first transmission circuit 11 having a transmission characteristic G are provided. Also, a first memory circuit 12 having a storage capacity of M which is equivalent to at least more than two times the impulse response duration $\alpha$ of the transmission circuit 11, is provided for storing an input signal in a predetermined time sequence and transmitting the same in the reverse of the time sequence for the length M of time. A second memory circuit 13 having a storage capacity of M which is equivalent to at least more than two times the impulse response duration $\alpha$ of the transmission circuit 11, is arranged for storing an input signal in a given time sequence and transmitting the same in the reverse of the time sequence for the period M after a delay time ranging from $\alpha$ to M$-\alpha$ from the action of the first memory circuit 12. Elements 14 and 15 are second and third transmission circuits which have the same transmission characteristic as that of the first transmission circuit 11. A third 16 and a fourth memory circuit 17 each having an equal storage capacity M are arranged for storage of an input signal in a given time sequence and transmission of the same in the reverse of the time sequence for the period M. A switch circuit 18 is also provided for transmitting during the period M an output signal of the third memory circuit 16 from the start of an action of the first memory circuit 12 to the start of an action of the second memory circuit 13 and an output signal of the fourth memory circuit 17 from the start of the action of the second memory circuit 13 to the start of a succeeding action of the first memory circuit 12. A timing generator circuit 20 is provided for actuating the two memory circuit 12 and 16 and the switch circuit 18 at predetermined intervals of time. Also, a delay circuit 19 is provided for delaying an output signal of the timing generator circuit 20 and supplying to the two memory circuits 13 and 17 a resultant delay signal delayed by a given time from the start of the action of the first memory circuit 12. Element 21 is an output terminal.

Figure 2B:
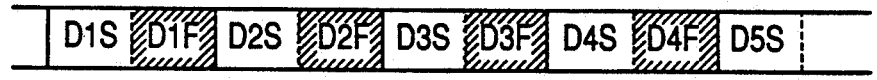
Figure 2C:
Figure 2D:
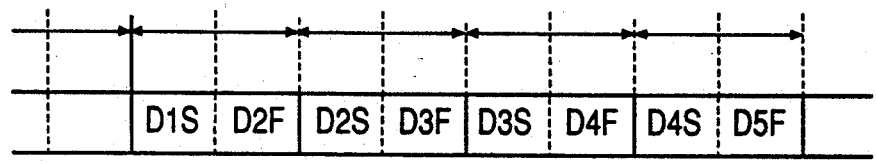

In operation, an input signal (e.g. an analog or digital video signal) is fed through the input terminal 10 to the first transmission circuit 11 of transmission rate G. It is assumed that the input terminal 10 receives an input signal shown in FIG. 2(a), which is expressed as a series of data blocks D1F, D1S, D2F, D2S, and so on. The signal from the first transmission circuit 11 is fed to the first memory circuit 12 where it is time base inverted at each duration (equal to the period M) from t0 to t1, t2 to t4, or t4 to t6. The signal is then transferred to the second transmission circuit 14 where its particular data blocks including D1F, D2F, and D3F, which are spaced by more than the period $\alpha$ (of impulse response duration) from the switching point for time base inversion, can successfully be processed regardless of the effects of a switching action, as shown in FIG. 2(b). The signal is then time base inverted by the third memory circuit 16 to a row of the data blocks shown in FIG. 2(c).

Figure 2E:
Figure 2F:
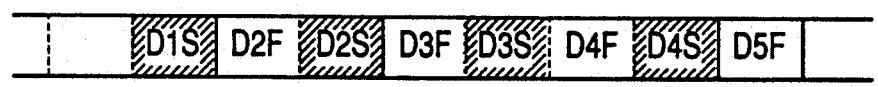
Figure 2G:
Figure 2H:
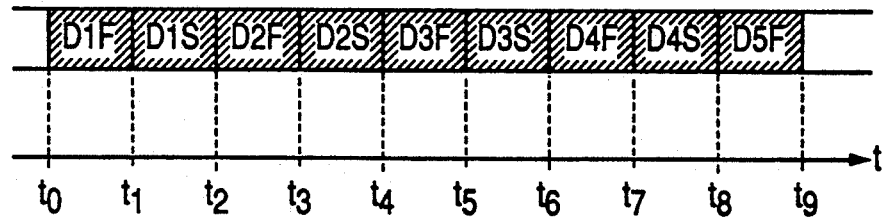

The second memory circuit 13 starts to operate (at a time t1) later than the first memory circuit 12. The data blocks including D1S, D2S, ad D3S shown in FIG. 2(e) are processed by the third transmission circuit 15.

The switch circuit 18 selects the output of the memory circuit 16 during the periods of t0 to t1, t2 to t3, and t4 to t5 and of the memory circuit 17 during the periods of t1 to t2, t3 to t4, and t5 to t6. Accordingly, a row of the processed data blocks shown in FIG. (2h) will be released.

FIGS. 3(a)-3(j) illustrate the foregoing procedure using waveforms of the signal, in which FIG. 3(a) is the waveform of the original input signal; FIG. 3(b) is the waveform produced by the first transmission circuit 11; FIG. 3(c) is the waveform after time base inversion at unit periods of t0 to t2, t2 to t4, t4 to t6, and so on; FIG. 3(d) is the waveform after one more time base inversion action; FIG. 3(f) is the waveform after time base inversion at unit periods of t1 to t3, t3 to t5, t5 to t7, and so on; FIG. 3(g) is the waveform produced by the transmission circuit 15; FIG. 3(h) is the waveform after a further time base inversion action; FIG. 3(i) is the waveform of a control signal of the switch circuit 18, and FIG. 3(j) is the waveform of the signal after switching action of the switch circuit 18.

As apparent from FIGS. 3(a)-3(j) the waveform of FIG. 3(j) contains emphasis characteristics including preshoot and overshoot peaks. Both the preshoot and overshoot peaks in the emphasis stay between the two clip levels S1 and S2 and thus, no waveform distortion will occur in the FM demodulated playback signal.

The same effect will be obtained with the first transmission circuit 11 being coupled to the output of the switch circuit 18.

Figure 4:
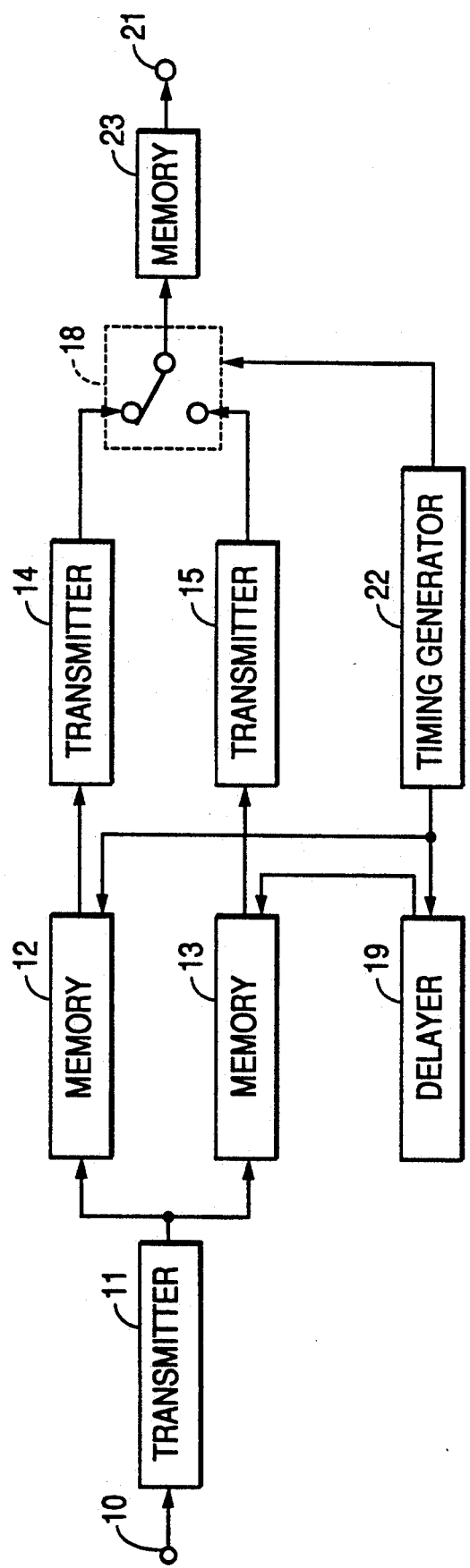
FIG. 4 is a block diagram of another signal processing circuit according to the present invention.

A second embodiment of the present invention will now be described referring to the relevant drawings. FIG. 4 is a block diagram showing a signal processing apparatus of the second embodiment and FIGS. 5(a)-5(f) illustrate a procedure of signal processing of the signal processing apparatus.

As shown in FIG. 4, an input terminal 10 and a first transmission circuit 11 having a transmission characteristic G are provided. Also, a first memory circuit 12 having a storage capacity of M which is equivalent to at least more than two times the impulse response duration $\alpha$ of the transmission circuit 11 is provided for storing an input signal in a given time sequence and transmitting the same in the reverse of the time sequence for the period M. A second memory circuit 13 having a storage capacity of M which is equivalent to at least more than two times the impulse response duration $\alpha$ of the transmission circuit 11 is arranged for storing an input signal in a given time sequence and transmitting the same in the reverse of the time sequence for the period M after a delay time ranging from $\alpha$ to $M-\alpha$ from the action of the first memory circuit 12. Elements 14 and 15 are second and third transmission circuits which have the same transmission characteristic as of the first transmission circuit 11. A switch circuit 18 is also provided for transmitting during the period M an output signal of the third transmission circuit 15 from the start of an action of the first memory circuit 12 to the start of an action of the second memory circuit 13 and an output signal of the second transmission circuit 14 from the start of the action of the second memory circuit 13 to the start of a succeeding action of the first memory circuit 12. A third memory circuit 23 having a storage capacity ranging from at least $\alpha$ to $(M-\alpha)$, is provided for storing an input signal in a given time sequence and transmitting the same in the reverse of the time sequence. Also, a timing generator 22 is provided for actuating the memory circuit 12 and the switch circuit 18 at predetermined intervals of time. A delay circuit 19 is provided for delaying an output signal of the timing generator circuit 22 and supplying to the memory circuit 13 a resultant delay signal delayed by a given time from the start of the action of the first memory circuit 12. Element 21 is an output terminal.

The operation of the foregoing signal processing apparatus will be explained, as starting with a step at the switch circuit 18 because the preceding procedure up to the two transmission circuits 14 and 15 is identical to that of the first embodiment. The two signals fed from the transmission circuits 14 and 15 to the switch circuit 18 contain rows of the data blocks D1F, D2F, D3F ... and D1S, D2S, D3S ... respectively as shown in FIGS. 5(b) and 5(d). Then, a control signal shown in FIG. 5(e) is supplied from the timing generator circuit 22 to the switch circuit 18 which in turn selects the output signal of the transmission circuit 14 during unit periods of t1 to t2, t3 to t4, t5 to t6, and so on and from of the transmission circuit 15 during unit periods of t2 to t3, t4 to t5, t6 to t7, and so on. Accordingly, the processed signal shown in FIG. 5(f) will be produced.

The same effect will be obtained with the first transmission circuit 11 being coupled to the output of the switch circuit 18 or the third memory circuit 23 being coupled to where the line extends prior to separating into two branches.

Although the time base inversion is carried out on the basis of a two-phase system according to the first or second embodiment, it may be on three or more phases.

Also, the time base inversion which is executed throughout the period M may be delayed by M for each action.

Figure 6:
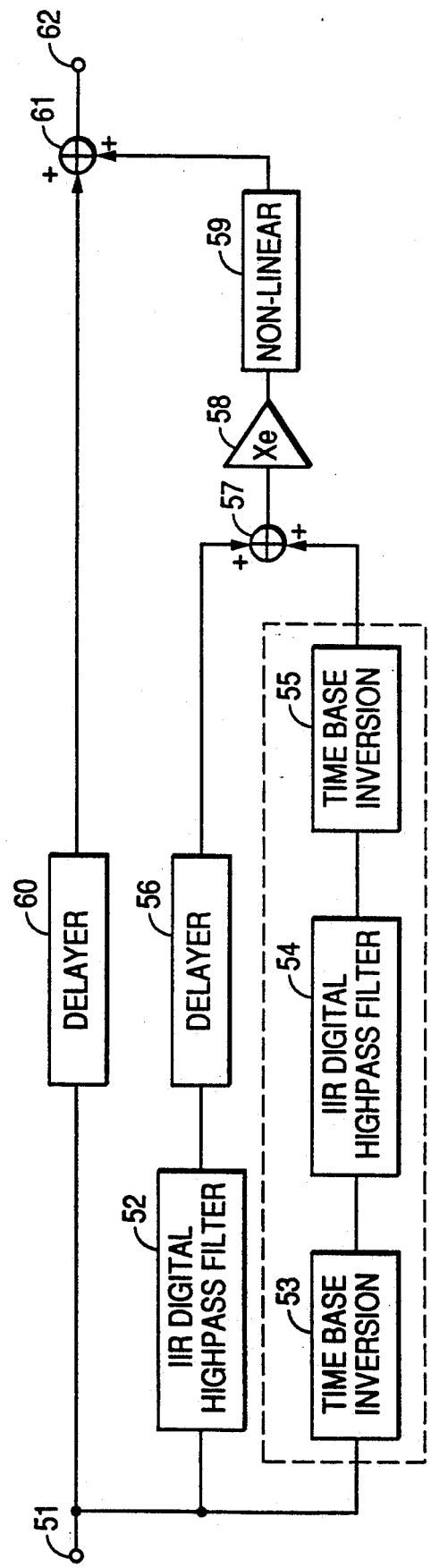
FIG. 6 is a block diagram showing the emphasizing section of a further signal processing circuit according to the present invention.

A third embodiment of the present invention will be described referring to the relevant drawings. Illustrated in FIG. 6 are an input terminal 51, two IIR (infinite impulse response) type digital highpass filters 52 and 54, two time base inversion circuits 53 and 55, two delay circuits 56 and 60, two adders 57 and 61, a non-linear circuit 59, and an output terminal 62.

In operation, a digital video signal is fed through the input terminal 51 to the IIR digital highpass filter 52 where its high frequency component is separated and also, to the time base inversion circuit 53 arranged parallel to the IIR digital filter 52. A time base inverted output of the time base inversion circuit 53 is transferred through the IIR digital highpass filter 54 to the time base inversion circuit 55 where it is inverted back to the original time base signal. The two time base inversion circuits 53 and 55 preferably contain digital memories for storage of the signal in time base blocks which are then retrieved in a reverse order to produce a time base inverted output. Each time base block of the video signal may be inverted on the basis of a horizontal scanning period, as will not be specified. An original time base output of the time base inversion circuit 55 is combined by the adder 57 with an output of the IIR digital highpass filter 52. In particular, the output of the IIR digital filter 52 which does not match in the time base with that of the time base inversion circuit 55 is hence time base adjusted by the delay circuit 56 before transferring to the adder 57. An output from the adder 57 is linearly amplified to Xe times by an amplifier 58 and then, amplitude limited by the non-linear circuit 59. The non-linear circuit 59 is arranged to perform a linear action while the amplitude of an input signal remains below a threshold value th and deliver a value th equal to the threshold value th when it exceeds the threshold th. An output from the non-linear circuit 59 is added by the adder 61 to the signal directly fed from the input terminal 51 across the delay circuit 60 where a time delay is given. Accordingly, the output terminal 62 receives a non-linear emphasized signal which becomes greater in the emphasis level as its amplitude is decreased.

During playback, the emphasized signal is fed to a non-linear deemphasizing circuit for deemphasizing operation.

Figure 8:
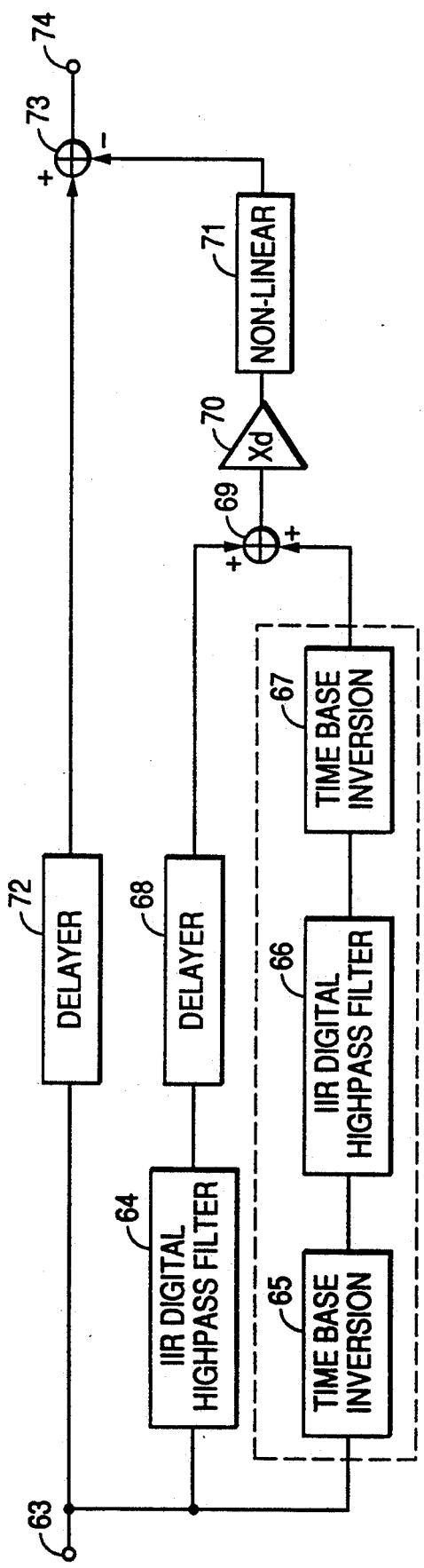
FIG. 8 is a block diagram showing a deemphasizing circuit associated with the emphasizing section shown in FIG. 6.

Such a non-linear deemphasizing circuit is schematically illustrated in FIG. 8, which is similar to the emphasizing circuit described above, except that the adder 61 is replaced by a subtracter 73. The deemphasizing circuit allows a smaller amplitude signal component to be more restrained and simultaneously, distortion error or noise produced in a transmission line to be attenuated.

Although the amplitude limited signal components in the non-linear processing circuit are hardly improved in noise reduction, they are much reduced in amount due to the use of a phase-linear type highpass filter, as compared with the prior art which employs phase-nonlinear filters. Distortion error and noise in the edges of a waveform which are inherent in the non-linear circuit will thus be reduced.

Figure 7:
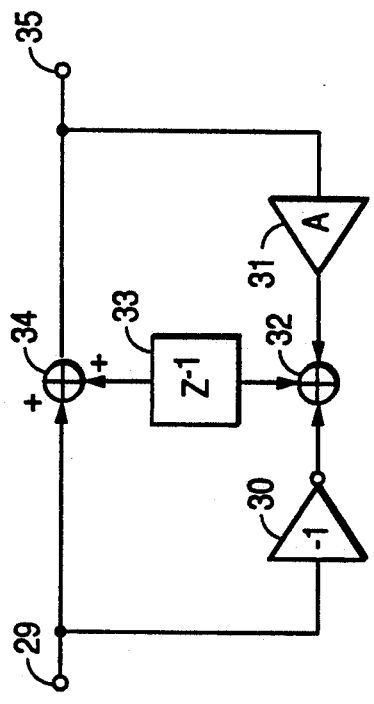
FIG. 7 is a block diagram of an IIR type digital highpass filter of the emphasizing section shown in FIG. 6.

Preferably, as shown in FIG. 7, each of the two IIR digital highpass filters 52 and 53 of the emphasizing circuit shown in FIG. 6 comprises an input terminal 29, an inversion amplifier 30, another amplifier 31, a first adder 32, a delayer 33, a second adder 34, and an output terminal 35. In action, an input signal from the input terminal 29 is polarity inverted by the inversion amplifier 30 and transferred to the adder 32 where it is added to a feedback signal from the amplifier 31. A sum signal from the adder 32 is delayed a given time by the delayer 33 and fed to the adder 34 where it is added to the main input signal directly fed from the input terminal 29. An output of the adder 34 is then amplified to a given number A of times by the amplifier 31. An amplified output of the amplifier 31 is fed as the feedback signal to the adder 32 and also, as an output signal to the output terminal 35 for further transmission. The amplifier 31 may be not of a linear type. When the amplifier 31 is of a non-linear type, a resultant digital filter exhibits a specific frequency characteristic which is varied between a great amplitude signal and a small amplitude signal. This will provide a complementary performance between emphasizing and deemphasizing actions and ensure more noise reduction.

A fourth embodiment of the present invention will be described, which is shown in a block diagram of FIG. 9. Unlike the first embodiment, the fourth embodiment has a different arrangement of the time base inverting IIR digital highpass filter circuit which will then be explained, while the remaining arrangements remain unchanged.

Figure 9:
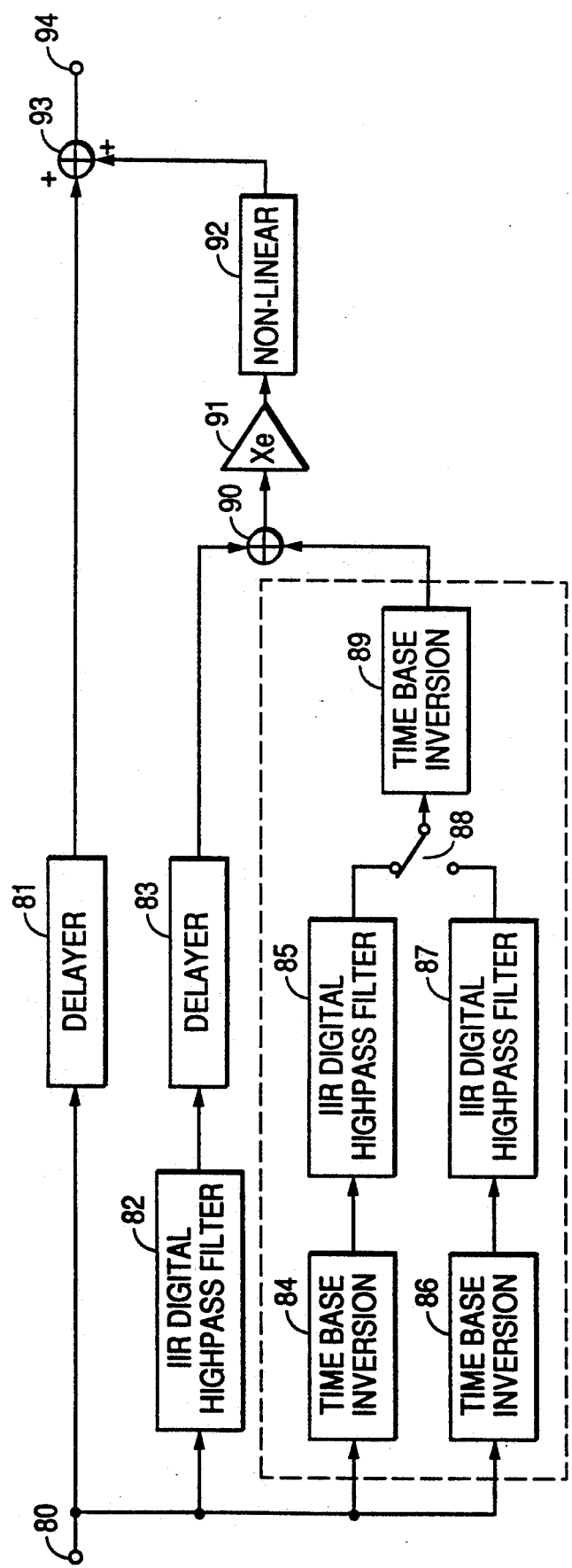
FIG. 9 is a block diagram showing the emphasizing section of a still further signal processing circuit according to the present invention.

The IIR digital highpass filter circuit for time base inversion defined by the dotted circle line in FIG. 6 is also shown in FIG. 9 as encircled by the dotted line. The IIR digital highpass filter circuit of FIG. 6 is arranged such that the duration of time base inversion is equal to an integer multiple of the horizontal scanning period for allowing a noise generated at each inversion start point not to become noticeable on a screen. This requires a corresponding memory for holding a video signal of interest for at least one horizontal scanning period or the duration of time base inversion.

The arrangement shown in FIG. 9 contains two of the time base inverting IIR digital highpass filter circuits of FIG. 6 including two IIR digital highpass filters 85 and 87. In operation, two time base inverted outputs of their respective filter circuits are alternated at intervals of a given time with the use of a switch 88 and then, inverted back to the original time base signal by a time base inversion circuit 89. As the result, the time base inverting circuit of FIG. 9 produces an output signal equal to that of the IIR digital highpass filter circuit of FIG. 6. The two IIR digital highpass filters 85 and 87 produce a waveform similar to shown in FIG. 3.

As understood, a phase-linear type highpass filter circuit can be established using a memory having a storage capacity of a few times the filter impulse response and the size of a memory required in a time base inversion circuit will be minimized.

Figure 10:
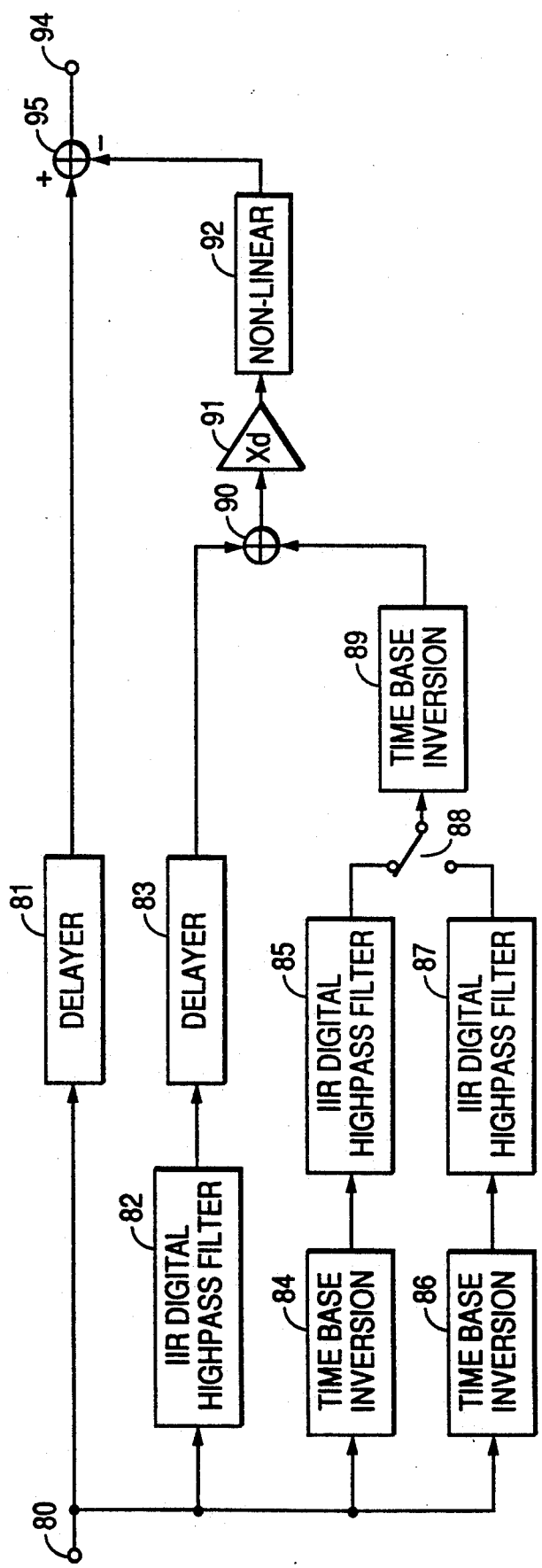
FIG. 10 is a block diagram showing a deemphasizing circuit associated with the emphasizing section shown in FIG. 9.
Figure 11:
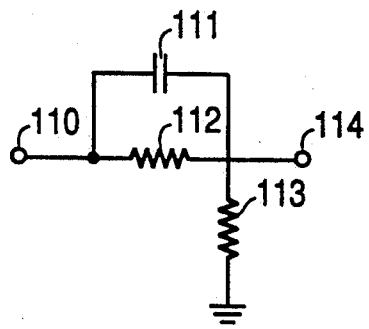
FIG. 11 is a block diagram showing a conventional signal processing circuit.
Figure 12:
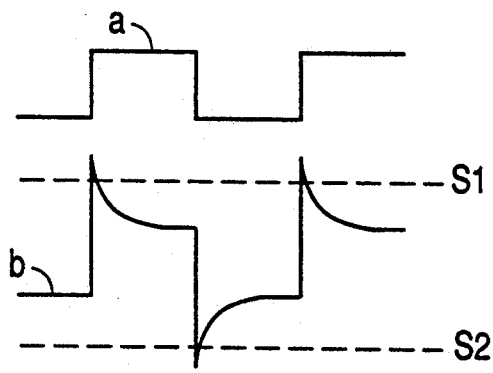
FIG. 12 is a waveform diagram of signals in the conventional signal processing circuit.
Figure 13:
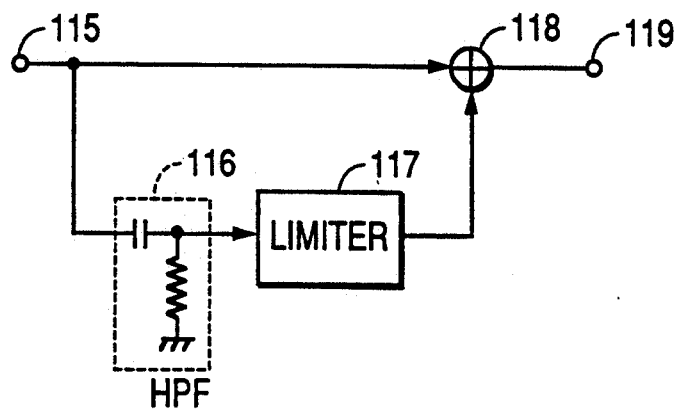
FIG. 13 is a block diagram of a known non-linear emphasizer circuit.
Figure 14A:
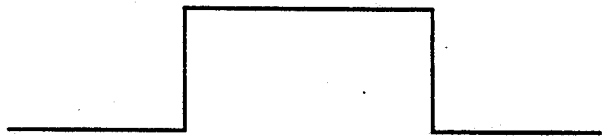
FIGS. 14(a)-14(d) are waveform diagrams of signals in the known non-linear emphasizer circuit.
Figure 14B:
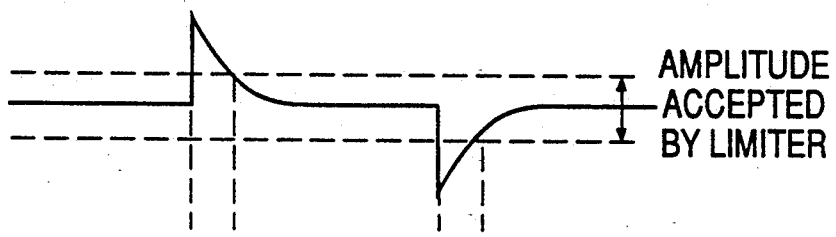
Figure 14C:
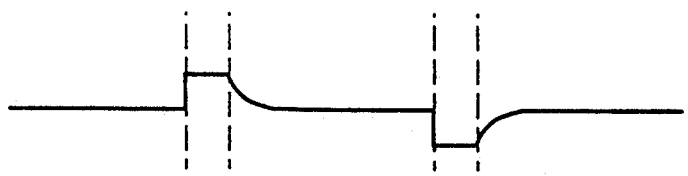
Figure 14D:
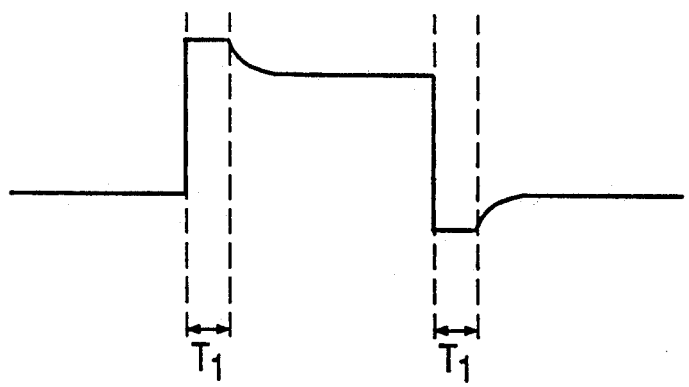

The deemphasizing circuit is also arranged by the same manner, as shown in FIG. 10. The arrangement shown in FIG. 10 is distinguished from the emphasizing circuit shown in FIG. 9 by the fact that the adder 93 is replaced by a subtracter 95. Similarly, the deemphasizing circuit of FIG. 10 allows a smaller amplitude signal component to be more restrained and simultaneously, allows distortion error or noise produced in a transmission line to be attenuated.

What is claimed is:

1. A signal processing apparatus comprising:
a first transmission circuit having a transmission characteristic of G and an impulse response duration of $\alpha$ for transmission of an input signal;
a first memory circuit having a storage capacity of M ($M \geq 2 \times \alpha$) for storing an output of the first transmission circuit in a predetermined time sequence and transmitting the same in a reverse time sequence to the predetermined time sequence;
a second transmission circuit having the transmission characteristic of G for transmission of an output of the first memory circuit;
a second memory circuit having the storage capacity of M for storing an output of the second transmission circuit for a length M of time and transmitting the same in a reverse time sequence to a storing time sequence;
a third memory circuit having the storage capacity of M for storing the output of the first transmission circuit after a delay time ranging from $\alpha$ to $(M-\alpha)$ from an action of the first memory circuit and transmitting the same in a reverse time sequence to a storing time sequence;
a third transmission circuit having the transmission characteristic of G for transmission of an output of the third memory circuit;
a fourth memory circuit having the storage capacity of M for storing an output of the third transmission circuit for the period M and transmitting the same in a reverse time sequence to a storing time sequence; and
a switch circuit for transmitting an output of the second memory circuit during a part of the period M from a start of an action of the first memory circuit to a start of an action of the third memory circuit and an output of the fourth memory circuit during the other part from the start of the action of the third memory circuit to a start of a succeeding action of the first memory circuit.

2. A signal processing apparatus comprising:
a first transmission circuit having a transmission characteristic of G and an impulse response duration of $\alpha$ for transmission of an input signal;
a first memory circuit having a storage capacity of M ($M \geq 2 \times \alpha$) for storing an output of the first transmission circuit in a predetermined time sequence and transmitting the same in a reverse time sequence to the predetermined time sequence;
a second transmission circuit having the transmission characteristic of G for transmission of an output of the first memory circuit;
a second memory circuit having the storage capacity of M for storing the output of the first transmission circuit for a length M of time after a delay time ranging from $\alpha$ to $(M-\alpha)$ from an action of the first memory circuit and transmitting the same in a reverse time sequence to a storing time sequence;

a third transmission circuit having the transmission characteristic of G for transmission of an output of the second memory circuit;

a switch circuit for transmitting an output of the third transmission circuit during a part of the period M from a start of an action of the first memory circuit to a start of an action of the second memory circuit and an output of the second transmission circuit during the other part from the start of the action of the second memory circuit to a start of a succeeding action of the first memory circuit; and a third memory circuit for having a storage capacity ranging from at least $\alpha$ to $(M-\alpha)$ for storing an output of the switch circuit and transmitting the same in a reverse time sequence to a storing time sequence.

3. A signal processing apparatus comprising:

a first IIR type digital filter for band-limit filtering an input digital video signal;

a first time base inverting circuit for storing the input digital video signal in a predetermined time sequence and transmitting the same in a reverse time sequence to the predetermined time sequence;

a second IIR type digital filter for band-limit filtering an output of the first time base inverting circuit;

a second time base inverting circuit for storing an output of the second IIR type digital filter and transmitting the same in a reverse sequence to a storing time sequence a first adder for adding an output of the second time base inverting circuit to an output of the first IIR type digital filter which has been time base matched;

a linear amplifier circuit for amplifying a sum output of the first adder by a predetermined rate;

a non-linear circuit for converting an amplitude of an output of the linear amplifier circuit to a non-linear form; and a second adder for summing an output of the non-linear circuit and the input digital video signal, which has been time base matched, to a signal which contains less phase distortion as compared with the input digital video signal and becomes increased in the effect of amplification as its amplitude is decreased.

4. A signal processing apparatus according to claim 3, further comprising a non-linear circuit provided in a feed-back loop of the two, first and second, IIR type filters so that the frequency characteristic is different between a large amplitude signal and a small amplitude signal.

5. A signal processing apparatus comprising:

a first IIR type digital filter for band-limit filtering an input digital video signal;

a first time base inverting circuit for storing the input digital video signal in a predetermined time sequence and transmitting the same in a reverse time sequence to the predetermined time sequence;

a second IIR type digital filter for band-limit filtering an output of the first time base inverting circuit;

a second time base inverting circuit for storing an output of the second IIR type digital filter and transmitting the same in a reverse time sequence to a storing time sequence;

an adder for adding an output of the second time base inverting circuit to an output of the first IIR type digital filter which has been time base matched;

a linear amplifier circuit for amplifying a sum output of the adder by a predetermined rate;

a non-linear circuit for converting an amplitude of an output of the linear amplifier circuit to a non-linear form; and a subtractor for subtracting an output of the non-linear circuit from the original input digital video signal, which has been time base matched, thus to produce a signal which contains less phase distortion as compared with the input digital video signal and becomes increased in the effect of amplitude restriction as its amplitude is decreased.

6. A signal processing apparatus according to claim 5, further comprising a non-linear circuit provided in a feed-back loop of the two, first and second, IIR type filters so that frequency characteristic is different between a large amplitude signal and a small amplitude signal.

7. A signal processing apparatus comprising:

a first IIR type digital filter for band-limit filtering an input digital video signal;

N (N is an integer) time base inverting circuits arranged parallel to the first IIR type digital filter for time base inverting the input signal at intervals of a predetermined time;

N IIR type digital filters for band-limit filtering N outputs of the time base inverting circuits respectively;

a selector switch for selectively transmitting N outputs of the IIR type digital filters in a row;

an (N+1)th time base inverting circuit for time base inverting the row of outputs of the selector switch to their original time base forms;

an adder for adding an output of the (N+1)th time base inverting circuit to an output of the first IIR type digital filter which has been time base matched;

a linear amplifier circuit for amplifying a sum output of the adder by a predetermined rate;

a non-linear circuit for converting an amplitude of an output of the linear amplifier circuit to a non-linear form; and another adder for summing an output of the non-linear circuit and the input digital video signal, which has been time base matched, to a signal which contains less phase distortion as compared with the input digital video signal and becomes increased in the effect of amplification as its amplitude is decreased.

8. A signal processing apparatus comprising:

a first IIR type digital filter for band-limit filtering an input digital video signal;

N (N is an integer) time base inverting circuits arranged parallel to the first IIR type digital filter for time base inverting the input signal at intervals of a predetermined time;

N IIR type digital filters for band-limit filtering N outputs of the time base inverting circuits respectively;

a selector switch for selectively transmitting N outputs of the IIR type digital filters in a row;

an (N+1)th time base inverting circuit for time base inverting a row of outputs of the selector switch to their original time base forms;

an adder for adding an output of the (N+1)th time base inverting circuit to an output of the first IIR type digital filter which has been time base matched;

a linear amplifier circuit for amplifying a sum output of the adder by a predetermined rate;

a non-linear circuit for converting an amplitude of an output of the linear amplifier circuit to a non-linear form; and a subtractor for subtracting an output of the non-linear circuit from the input digital video signal, which has been time base matched, thus to produce a signal which contains less phase distortion as compared with the input digital video signal and becomes increased in the effect of amplification as its amplitude is decreased.

* * * * *

UNITED STATES PATENT AND TRADEMARK OFFICE
CERTIFICATE OF CORRECTION

PATENT NO. : 5,299,003
DATED : March 29, 1994
INVENTOR(S) : Atsuo OCHI et al.

It is certified that error appears in the above-indentified patent and that said Letters Patent is hereby corrected as shown below:

On the Title Page, between Items [22] and [51] add:

--[30] Foreign Application Priority Data
March 14, 1991 [JP] Japan ........... 3-049523
March 20, 1991 [JP] Japan ........... 3-056640
March 20, 1991 [JP] Japan ........... 3-056641
June 24, 1991  [JP] Japan ........... 3-151368--.

Signed and Sealed this

Thirtieth Day of August, 1994

Attest:

BRUCE LEHMAN

*Attesting Officer*     *Commissioner of Patents and Trademarks*